United States Patent [19]
Mellot

[11] Patent Number: 5,920,217
[45] Date of Patent: Jul. 6, 1999

[54] 50% DUTY CYCLE SIGNAL GENERATOR

[75] Inventor: Pascal Mellot, Lans-eu-Vercors, France

[73] Assignee: SGS-Thomas Microelectronics Limited, Almondsbury Bristol, United Kingdom

[21] Appl. No.: 08/738,166

[22] Filed: Oct. 25, 1996

[30] Foreign Application Priority Data

Oct. 31, 1995 [GB] United Kingdom .................... 9522223

[51] Int. Cl.⁶ .............................. H03K 3/017; H03K 5/04
[52] U.S. Cl. ............................ 327/175; 327/35; 327/114; 327/378; 331/74
[58] Field of Search ..................................... 327/172, 175, 327/113, 114, 31, 35, 378, 513, 539, 362; 331/74

[56] References Cited

U.S. PATENT DOCUMENTS

| | | | |
|---|---|---|---|
| 4,003,078 | 1/1977 | Owen ....................................... | 327/227 |
| 4,239,992 | 12/1980 | Perkins ..................................... | 327/175 |
| 4,599,736 | 7/1986 | Hoppe ..................................... | 375/110 |
| 4,694,157 | 9/1987 | Mishina ................................... | 327/513 |
| 4,963,872 | 10/1990 | Schneider et al. ....................... | 341/142 |
| 5,053,639 | 10/1991 | Taylor . | |
| 5,061,907 | 10/1991 | Rasmussen .......................... | 331/108 B |
| 5,230,013 | 7/1993 | Hanke et al. ............................ | 327/175 |
| 5,339,078 | 8/1994 | Vernon ................................... | 327/374 |
| 5,397,945 | 3/1995 | Shum et al. ............................... | 327/77 |
| 5,477,180 | 12/1995 | Chen ........................................ | 327/175 |
| 5,491,440 | 2/1996 | Uehara et al. .......................... | 327/175 |
| 5,491,441 | 2/1996 | Goetschel et al. ........................ | 331/74 |
| 5,512,861 | 4/1996 | Sharma ..................................... | 331/74 |

FOREIGN PATENT DOCUMENTS

| | | | |
|---|---|---|---|
| A-0 343 899 | 11/1989 | European Pat. Off. ........ | H03K 5/156 |
| A-0 565 983 | 10/1993 | European Pat. Off. ......... | H03K 5/08 |
| 59-49014 | 3/1984 | Japan ............................... | H03K 5/08 |

*Primary Examiner*—Timothy P. Callahan
*Assistant Examiner*—Terry L. Englund
*Attorney, Agent, or Firm*—Wolf, Greenfield & Sacks, P.C.

[57] ABSTRACT

A circuit for generating a signal with a 50% duty cycle comprises an oscillator that provides a first control signal, a reference generator that provides a first reference signal, a control circuit that provides a second control signal and that is responsive to the first reference signal, a first current source load inverter that provides the second reference signal and that is responsive to the second control signal, and an output circuit that provides an output signal having a duty cycle substantially equal to 50% and a frequency substantially equal to that of the first control signal. The output circuit further includes a second current source load inverter that is responsive to both the first and second control signals.

13 Claims, 6 Drawing Sheets

50% DUTY CYCLE SIGNAL GENERATOR

FIELD OF THE INVENTION

The present invention relates to a circuit for generating an output signal that has a 50% duty cycle.

BACKGROUND OF THE INVENTION

The following figures, which illustrate the various embodiments of the prior art and of the present invention, may incorporate the same or similar elements. Therefore, where the same or similar elements occur throughout the various figures, they will be designated in the same manner.

Figure 1:
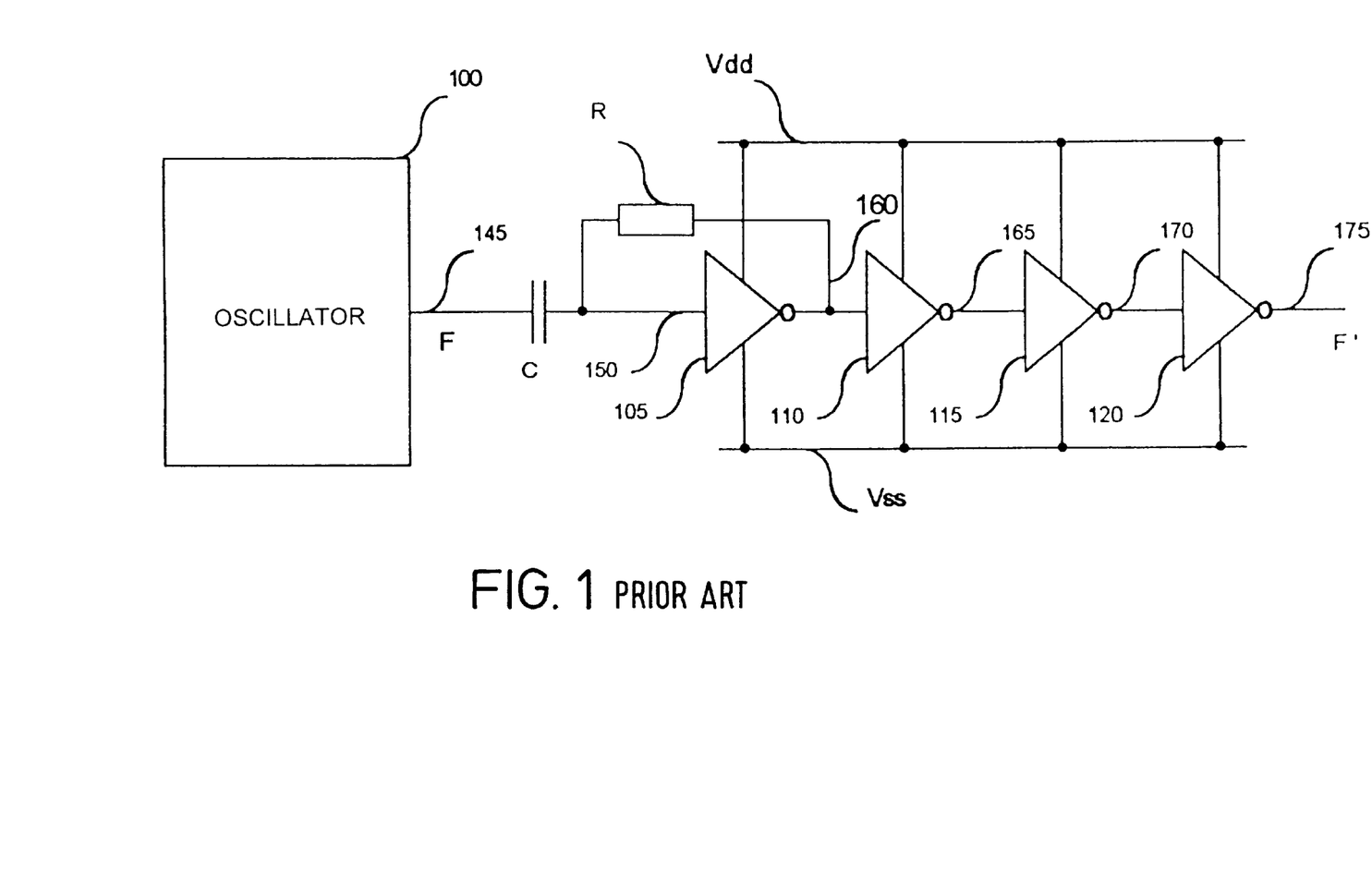
FIG. 1 illustrates an already depicted schematic diagram of a known circuit.

FIG. 1 illustrates a schematic diagram of a known circuit that generates an output signal that typically has a duty cycle of 50%.

This prior art circuit comprises an oscillator 100, a coupling capacitor C, a resistor R, and, in this particular example, a series of four cascaded CMOS inverters.

The oscillator 100 provides a sinusoidal signal F that has a frequency f on its output terminal 145. This signal F, which is a.c. coupled via the capacitor C, is used to drive the input 150 of the first inverter 105. All the inverters are connected to positive and negative voltage supply rails, respectively Vdd and Vss. The resistor R is connected between the input and output terminals 150, 160 of inverter 105, so as to d.c. bias the input 150 of the inverter 105. The effect of this resistor R is that both the input and output terminals 150, 160 of inverter 105 are biased at Vdd/2: assuming Vss is at ground potential, i.e. 0 volts. This bias voltage Vdd/2 corresponds to the mid-point in the linear region of the transfer function of the inverter 105. Therefore, when the input terminal 150 of inverter 105 is biased at Vdd/2, current will continually flow between the p-type and n-type MOS transistors of inverter 105: it should be noted that the transistors of the inverter will be designed so as to limit the amount of current flowing between the supply rails Vdd and Vss.

The output 160 of the first inverter 105 is connected to the input of the second inverter. The output 165 of the second inverter 110 is connected to the input of the third inverter. The output 170 of the third inverter 115 is connected to the input of the fourth inverter 120, whose output 175 provides a substantially square wave signal F' that has a frequency f' that is substantially equal to the frequency f of the signal F and that has a duty cycle typically equal to 50%.

However, the circuit of FIG. 1 suffers from a drawback. This drawback results in a deviation of some 15% or more in the duty cycle from its required 50% and is caused by the dispersion in the threshold voltages, VTh's, and the transconductance's of the n-type and p-type transistors that make up the CMOS inverters. These dispersions are in turn caused by variations in the process technology and/or by changes in temperature.

Such deviations in the 50% duty cycle cannot be tolerated by systems or digital circuits that rely on the square wave output signal's duty cycle remaining at, or substantially about, 50%.

SUMMARY OF THE INVENTION

Accordingly, an object of the present invention is to provide a circuit that provides an output signal having a duty cycle that equals, or substantially equals, 50%, wherein the variation in the duty cycle is less sensitive to variations in the process technology and/or temperature.

In order to achieve these objects, the present invention proposes a circuit for generating an output signal that comprises an oscillator for providing a first control signal that has a frequency f, characterised in that it comprises a reference generator that provides a first reference signal that represents a voltage difference between a first and a second voltage supply; control circuitry that is responsive to the first reference signal and a second reference signal for providing a second control signal; a first current source load inverter that is responsive to and controlled by the second control signal for providing the second reference signal, said second reference signal being substantially equal to the first reference signal; and circuitry, for providing the output signal that has a duty cycle substantially equal to 50% and which has a frequency substantially equal to f, that comprises a second current source load inverter, which is substantially the same as the first current source load inverter, that is responsive to and controlled by the first and second control signals. The first reference signal being a periodic signal having a duty cycle of 50%; non-exhaustive examples of the first reference signal being a sinusoid, a square wave and a triangular wave.

According to another embodiment of the present invention, the first current source load inverter comprises a first current source and a first switch that are serially connected between the first and second voltage supplies, the first current source being responsive to and controlled by the second control signal for providing the second reference signal at the common connection between the first current source and first switch, the first switch being responsive to and controlled by the second reference signal and the second current source load inverter comprises a second current source that is substantially identical to the first current source and a second switch that is substantially identical to the first switch, the second current source and second switch being serially connected between the first and second voltage supplies, the second current source being responsive to and controlled by the second control signal for providing the output signal at the common connection between the second current source and second switch, the second current source load inverter has an additional resistor and capacitor attached to it, the capacitor is connected in series with the control terminal of the second switch that is responsive to and controlled by the first control signal which is a.c. coupled to the control terminal via the capacitor, the resistor is connected between the common connection of the second current source and second switch and the control terminal of the second switch so as to operatively d.c. bias said common connection.

According to another embodiment of the present invention, the circuitry for providing the output signal comprises a plurality of current source load inverters which are substantially the same as the first current source load inverter.

According to another embodiment of the present invention, the first current source load inverter comprises a first current source and a first switch that are serially connected between the first and second voltage supplies, the first current source being responsive to and controlled by the second control signal for providing the second reference signal at the common connection between the first current source and first switch, the first switch being responsive to and controlled by the second reference signal. The first current source load inverter of the plurality of current source load inverters comprises a second current source that is substantially identical to the first current source and a second switch that is substantially identical to the first switch, the second current source and second switch being serially connected between the first and second voltage supplies, the second current source being responsive to and controlled by the second control signal for providing a third control signal at the common connection between the second current source and second switch, the second current source load inverter has an additional resistor and capacitor attached to it, the capacitor is connected in series with the control terminal of the second switch that is responsive to and controlled by the first control signal which is a.c. coupled to the control terminal via the capacitor, the resistor is connected between the common connection of the second current source and second switch and the control terminal of the second switch so as to operatively d.c. bias said common connection. The second current source load inverter of the plurality of current source load inverters comprises a third current source that is substantially identical to the first and second current sources and a third switch that is substantially identical to the first and second switches, the third current source and third switch being serially connected between the first and second voltage supplies, the third current source being responsive to and controlled by the second control signal for providing a forth control signal at the common connection between the third current source and third switch, the third switch being responsive to and controlled by the third control signal. The last, i.e. the $n^{th}$, current source load inverter of the plurality of current source load inverters comprises an $n^{th}$ current source that is substantially identical to the first, second, . . . $(n-1)^{th}$ current sources and an $n^{th}$ switch that is substantially identical to the first, second, . . . $(n-1)^{th}$ switches, the $n^{th}$ current source and $n^{th}$ switch being serially connected between the first and second voltage supplies, the $n^{th}$ current source being responsive to and controlled by the second control signal for providing the output signal at the common connection between the $n^{th}$ current source and $n^{th}$ switch, the $n^{th}$ switch being responsive to and controlled by the $(n-1)^{th}$ control signal.

According to another embodiment of the present invention, the current sources and switches are respectively implemented by operatively connected and controlled p-type and n-type MOS transistors.

According to another embodiment of the present invention, the current sources and switches are respectively implemented by operatively connected and controlled n-type and p-type MOS transistors.

According to another embodiment of the present invention, the output signal is amplified by one or more buffers.

According to another embodiment of the present invention, the reference generator comprises a potential divider network.

According to another embodiment of the present invention, the potential divider network is adjustable.

According to another embodiment of the present invention, the control circuitry comprises an amplifier having a positive input that is responsive to the first reference signal and a negative input that is responsive to the second reference signal.

According to another embodiment of the present invention, the first reference signal represents half of the voltage difference between the first and second voltage supplies.

According to another embodiment of the present invention, the first control signal is sinusoidal.

Additionally, in order to achieve these objects, the present invention proposes a circuit for generating an output signal that comprises an oscillator for providing a first control signal that has a frequency f and circuitry that is responsive to the first control signal for providing the output signal, wherein the circuit further comprises circuitry for providing a second control signal, said circuitry for providing the output signal being responsive to the second control signal such that the output signal has a frequency substantially equal to f and a duty cycle substantially equal to 50%.

These and other objects, as well as other advantages and features, of the present invention will become apparent in light of the following detailed description and accompanying drawings.

BRIEF DESCRIPTION OF THE DRAWINGS

FIG. 3b illustrates another embodiment of FIG. 3a;

DESCRIPTION OF THE PREFERRED EMBODIMENT

Figure 2:
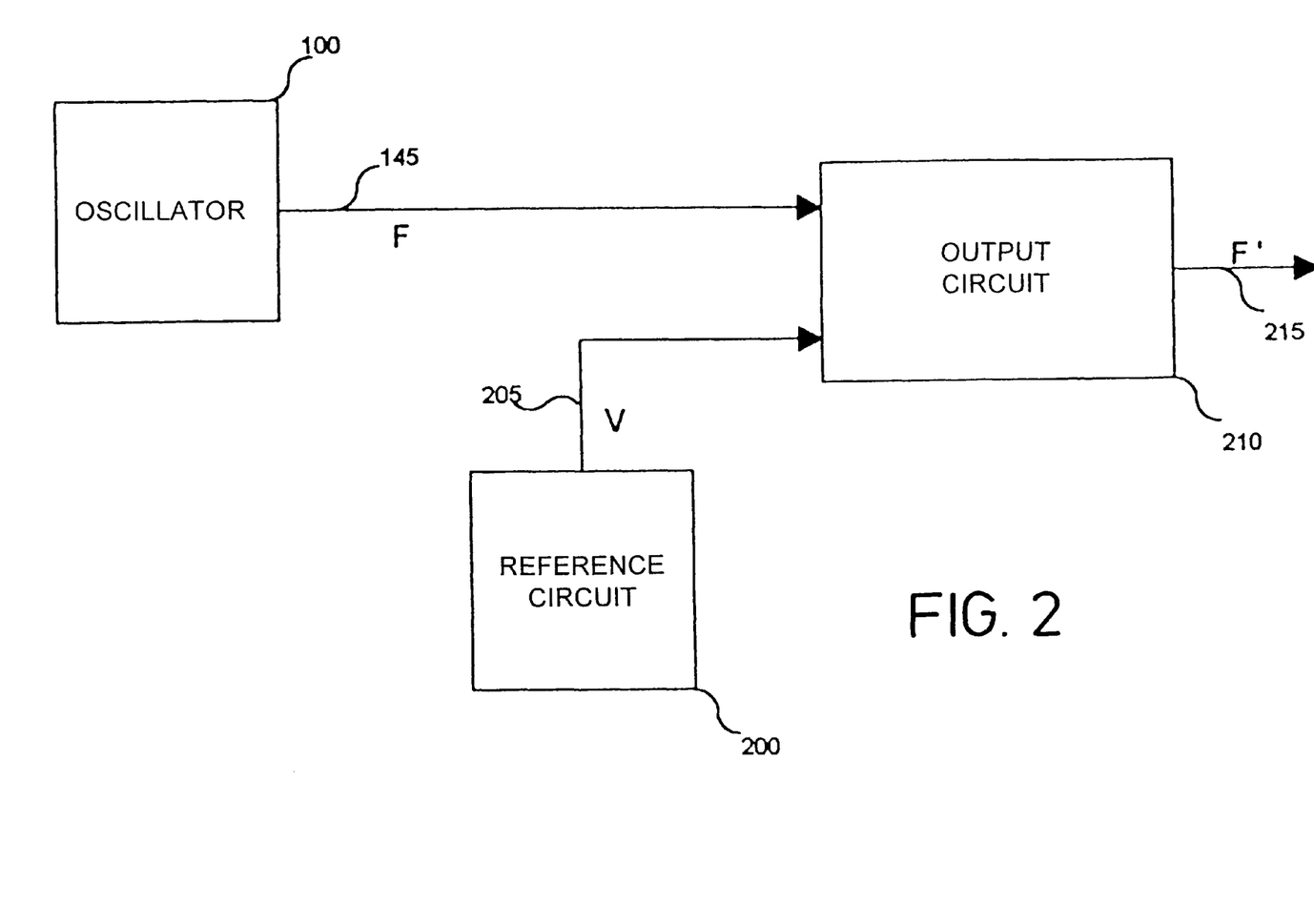
FIG. 2 illustrates a block diagram of circuit elements for generating an output signal that has a 50% duty cycle according to the present invention.

FIG. 2 illustrates a block diagram of circuit elements for generating an output signal that has a 50% duty cycle according to the present invention.

This figure comprises an oscillator 100 that provides a control signal F having a frequency f on its output 145, circuitry 200 that provides a control signal V on its output terminal 205 and circuitry 210, which is responsive to the control signals F and V, that produces an output signal F' on its output 215 that has a frequency f' that is equal to, or substantially equal to, the frequency f and a duty cycle, i.e. a mark-to-space ratio, that is equal to, or substantially equal to, 50%.

Figure 3A:
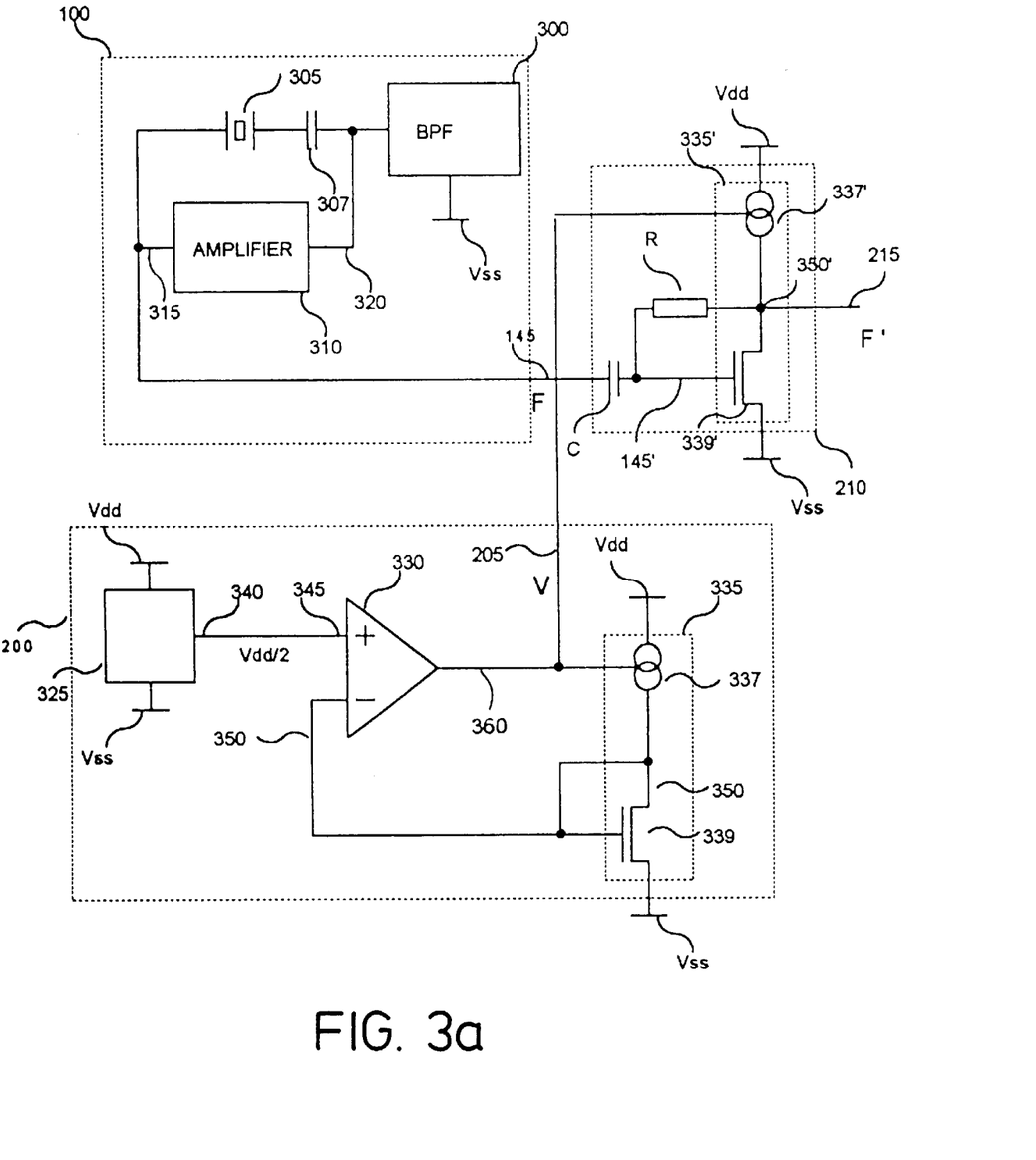
FIG. 3a illustrates a partial block and a partial circuit diagram of the circuit elements illustrated in FIG. 2.

FIG. 3a illustrates a partial block and a partial circuit diagram of the circuit elements illustrated in FIG. 2.

The oscillator 100 is illustrated as comprising a band pass filter (BPF) 300, a piezoelectric crystal 305, i.e. a quartz crystal, a coupling capacitor 307, and a first amplifier 310. It should be noted that it is possible to replace the relatively expensive crystal 305 with a cheaper ceramic resonator (not illustrated) provided that the dispersions in the value of the ceramic resonator and its ageing effects can be tolerated in the final design.

The crystal 305 is connected between the input 315 of the amplifier and the first plate of capacitor 307; the second plate of capacitor 307 is connected to the output 320 of the amplifier 310. The BPF 300 is connected between the voltage supply rail Vss and the output 320 of the amplifier, i.e. the common connection 320 between the output of the amplifier 310 and the second plate of capacitor 307. The input of the amplifier also constitutes the output terminal 145 of the oscillator 100.

The amplifier 310, capacitor 307 and BPF 300 are operatively connected to the crystal 305 such that the signal F at the input to the amplifier 310 has been sufficiently amplified and processed so that it is capable of operatively controlling a switch that is situated in the circuitry 210.

By way of an example, consider the following. The band pass filter 300 is tuned, in this particular example, such that the third harmonic of the crystal's frequency, which for an 18 MHz crystal will be 54 MHz, is the centre frequency: the filter having a cut-off frequency of approximately +/−5 MHz. Therefore, the crystal 305 is stimulated by the amplifier 310 such that it provides a sinusoidal control signal F with a peak-to-peak amplitude of approximately 2 volts at a frequency f of 54 MHz to output terminal 145 of the oscillator 100.

It should be noted that the sinusoidal control signal F can be provided by other means and methods and that the provision of such a signal F is therefore not intended to be limited to the example described above.

In a preferred embodiment of the present invention, the circuitry 200 for providing the control signal V comprises a voltage reference generator 325, a second amplifier 330 and a reference current source load inverter 335 that comprises a current source 337 and a switch 339, which has in this particular example been illustrated in the form of an n-type MOS transistor. For the purposes of clarification, the term 'current source load inverter' is intended to mean in this text a current source and a switch arrangement that are serially and operatively connected between the positive and negative voltage supply rails.

The reference generator 325 is connected between the supply rails Vdd and Vss and is designed such that the voltage appearing on its output 340 is substantially mid-way between the difference in the voltages Vdd and Vss. Assuming Vss is at ground potential, i.e. 0 volts, the voltage at the output 340 will substantially equal Vdd/2. The reference generator 325 can be implemented for example by a resistor divider network (not illustrated) that has matched, i.e. substantially equal, resistor values; the resistor divider network can also be adjustable as will be described further on in this text. The output 340 of the reference generator 325 is connected to the positive input 345 of the second amplifier 330.

The output 360 of the amplifier 330 is used to control the current sourced by the current source 337 and constitutes the output 205 of the circuitry 200.

The current source 337 is connected between the supply rail Vdd and the supply rail Vss via the drain 350 and source terminals of the n-type MOS switch 339.

The drain and gate terminals 350 of this transistor switch are connected together and to the low side of the current source 337 as well as to the negative input of the second amplifier 330. The source terminal of transistor switch 339 is connected to the supply Vss.

The reference generator 325, amplifier 330 and reference current source load inverter 335 are connected and operate together, according to the present invention, so that the control voltage output signal V of the amplifier 330 adjusts the current source 337 of the reference current source load inverter 335 such that the voltage appearing at drain terminal 350, i.e. the negative input of the amplifier 330, substantially equals the voltage Vdd/2 that is applied to the positive input 345 of the amplifier 330. In other words, the reference generator 325, amplifier 330 and reference current source load inverter 335 are connected and operate together so that the control signal V adjusts the current flowing through the current source 337 such that the voltage appearing at drain terminal 350 substantially equals Vdd/2.

A variation in the current flowing through the current source 337 would cause a variation in the voltage at the drain terminal 350. Such a variation in this current would be caused, other than by varying the signal V, by a variation in the process parameters and/or a variation in temperature. Therefore, according to the present invention, when such variations arise, the circuitry 200 automatically compensates for such variations by using the control signal V to alter the current flowing through the current source 337 and thus readjust the voltage appearing at the common connection between the current source 337 and switch 339 so that it again equals Vdd/2.

Note that as in the case of the aforementioned prior art, the current source load inverter is biased at Vdd/2 and current will continually flow between the current source 337 and the switch 339, which should be designed so as to limit the amount of current flowing between the supply rails Vdd and Vss.

In a preferred embodiment of the present invention, the circuitry 210 that provides the substantially square wave output signal F' that has a duty cycle equal to, or substantially equal to, 50% comprises a coupling capacitor C, a resistor R and a current source load inverter 335' that comprises the same elements as those found in the reference current source load inverter 335 within the circuitry 200.

The current source load inverter 335' comprises the current source 337' and the switch 339'. However, in a preferred embodiment of the present invention, the current source load inverter 335' differs from the reference current source load inverter 335 in that the resistor R is placed between the drain and gate terminals 350', 145' of the n-type MOS transistor switch 339'. The function of this resistor R will be described further on in the text.

The current source 337' is connected between the supply rail Vdd and the drain terminal 350' of the n-type switch transistor 339', whose source terminal is connected to the supply rail Vss.

The current source 337' of the current source load inverter 335' is responsive to the control signal V, in the same manner as the current source 337 of the current source load inverter 335, that is present at the output 205 of the circuit 200. The control signal V adjusts the current flowing through the current source 337' so that the voltage appearing at drain terminal 350' substantially equals the voltage at the output 340 of the reference generator 325, i.e. Vdd/2. The drain terminal 350' can be connected to amplifying circuitry (not illustrated), for example one or more inverters.

Again, a variation in the current flowing through the current source 337' would be caused, other than by varying the signal V, by a variation in the process parameters and/or a variation in temperature. Therefore, according to the present invention, when such variations arise, the circuitry 200 would also automatically compensate for such variations by using the control signal V to alter the current flowing through the current source 337' and thus the voltage appearing at the drain terminal 350'.

The control signal F passes from the output terminal 145 of the oscillator through the coupling capacitor C, because it appears as a low impedance to the signal F, and is presented to the connection 145' of the transistor switch 339', which is responsive to this control signal. Since this control signal F is a.c. coupled to the gate of the switching transistor 339', it is necessary to operatively bias the gate of this transistor 339' such that it switches at a rate that is substantially equal to the frequency f (54 MHz) of the signal F and that it produces an output signal F' that has a duty cycle equal to, or substantially equal to, 50%. The correct biasing of the gate of this switch transistor 339' is achieved by the resistor R.

Because the connection 145' between the capacitor C and transistor 339' presents a high impedance, the voltage present at this connection 145' is substantially equal to that at drain terminal 350'. Since the current source load inverter 335' is intentionally made to be the same as the current source load inverter 335, with the exception of the resistor R, it therefore follows that the voltage at drain terminal 350' and connection 145' will substantially equal the voltage at terminal 350, i.e. Vdd/2. Thus, the gate terminal 145' of transistor 339' is biased by resistor R to Vdd/2.

It is preferable that the value of the bias resistor R is chosen such that the gain of the current source load inverter 335' is as high as possible. It is preferable that the bias resistor R has a value which is at least equal to the output resistance Ro of the switch transistor 339', thus ensuring that the switch transistor has sufficient gain. The value of the output resistance Ro can be approximated to:

$$Ro=(\delta Vout/\delta I_D)=Va/I$$

where Va is the Early voltage and I is given by:

$$I_D=I=k.(Vin-VTh)^2.(1+Vout/Va)$$

where k=($\mu$.Cox.W)/2.L and

Vin=Vout=Vdd/2

The inventor found that for a 0.7 micron gate length, 5 volt CMOS process the value of Ro was approximately 50 Kohms.

The gain A of the switch transistor 339' is given by:

$$A==(\delta Vout/\delta Vin)=-(2.I.Va)/K.(Vdd/2-VTh)^3$$

A typical value for the gain A is approximately 20 dB.

Having now approximated the minimum value of the resistor R, it is now necessary to take into account the value of the coupling capacitor C for the chosen frequency f, which in this particular example is 54 MHz.

Figure 3B:
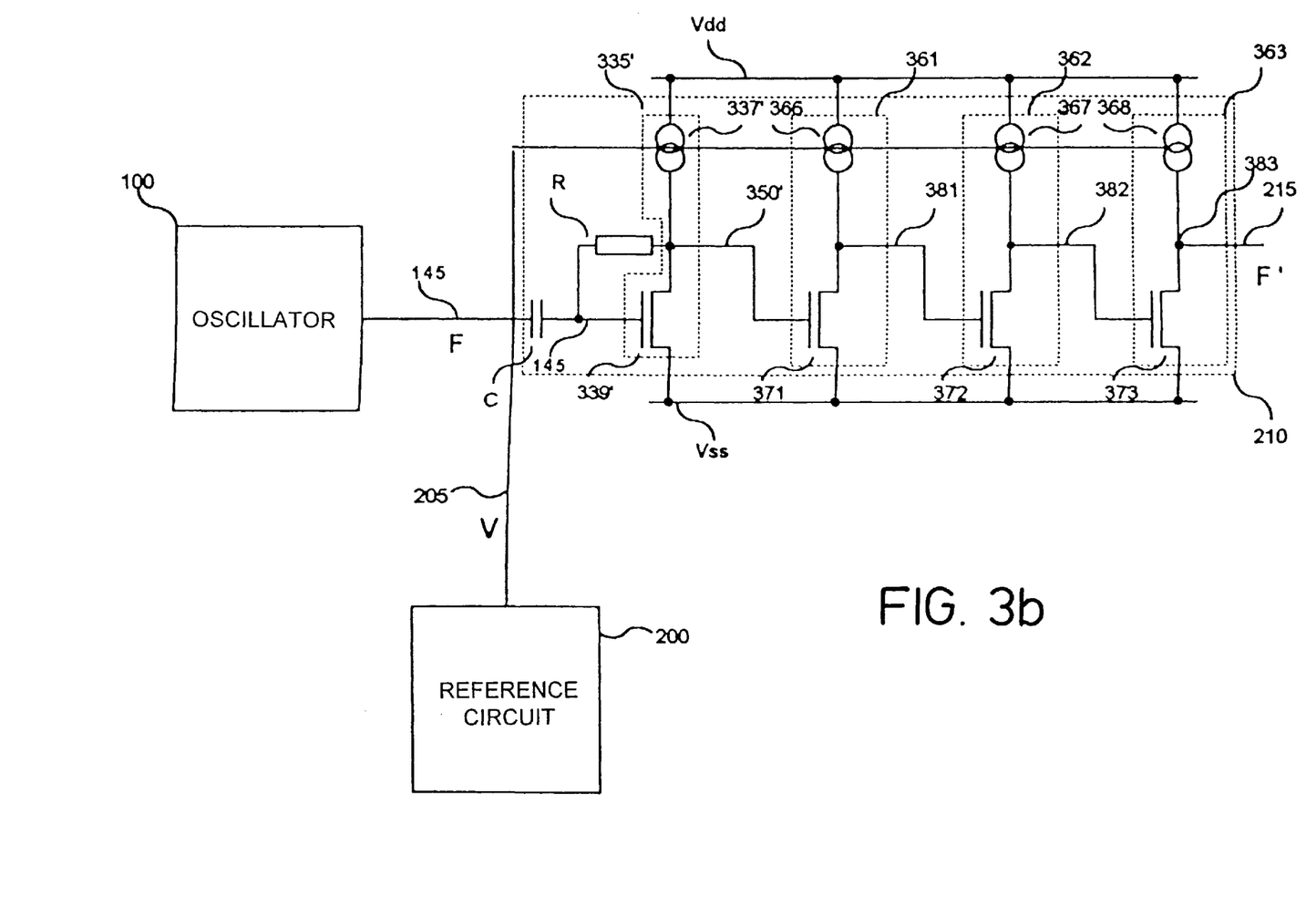

FIG. 3b illustrates a partial block and a partial circuit diagram of another embodiment of FIG. 3a.

In a preferred embodiment of the present invention the circuitry 210 comprises a plurality of cascaded switched current sources. In this particular example four such cascaded switched current sources 335', 361, 362 and 363 have been illustrated.

Each of these switched current sources 335', 361, 362 and 363 respectively comprise a current source 337', 366, 367 and 368 and a switch 339', 371, 372 and 373 in the form of an n-type MOS transistor.

Each of these current sources are connected between the supply rail Vdd and the respective drain terminals 350', 381, 382 and 383 of their associated transistors 339', 371, 372 and 373. The sources of these transistors 339', 371, 372 and 373 are connected to the supply rail Vss.

Each of the respective current sources 337', 366, 367 and 368 of the four switched current sources 335', 361, 362 and 363 are responsive to the control signal V that is present at the output 205 of the circuit 200. Therefore, control signal V adjusts, in unison, the current flowing through each of the current sources 337', 366, 367 and 368 so that the voltage appearing on the respective drain terminals 350', 381, 382 and 383 substantially equal the voltage at the output 340 of the reference generator 325, i.e. Vdd/2.

The drain terminal 350' is connected to the gate terminal of transistor 371 of the second current source load inverter 361.

The drain terminal 381 of transistor 371 of the second current source load inverter 361 is connected to the gate terminal of transistor 372 of the third current source load inverter 362.

Likewise, the drain terminal 382 of transistor 372 of the third current source load inverter 362 is connected to the gate terminal of the fourth current source load inverter 363.

The drain terminal 383 of transistor 373 of the fourth current source load inverter 363 constitutes the output 215 of the circuit 210 and provides the signal F'.

The drain terminal 383 can be connected to amplifying circuitry (not illustrated), for example one or more inverters.

Figure 4:
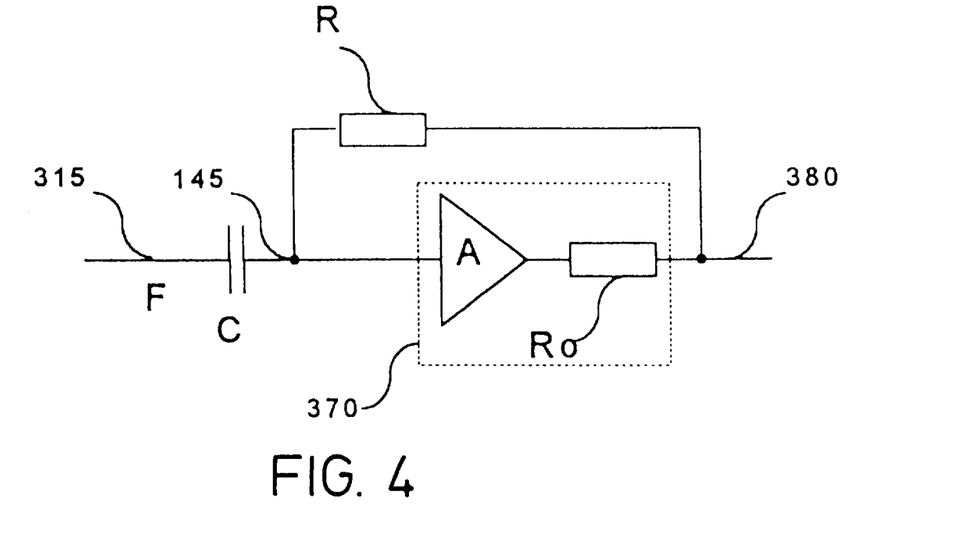
FIG. 4 illustrates a representative model of the switch transistor 370, the coupling capacitor C and the bias resistor R of FIG. 3.

FIG. 4 illustrates a representative model of the switch transistor 339', the coupling capacitor C and the bias resistor R of FIG. 3.

The capacitor C and resistor R are configured as a high pass filter. The gain G of this model is given by:

$$G=Vout/Vin$$

$$=[(Ro+A.R).C]/[(1-A)+(R+Ro).C]$$

The gain in the bandwidth is approximated by:

$$(Ro+A.R)/(R+Ro)=(1+A)/2$$

$$=(1+(-10))/2=-4.5$$

assuming R=Ro.

The cut-off frequency fc of this RC high pass filter is given by:

$$fc=(1-A)/(2\pi.(R+Ro).C)$$

Therefore, the value of the capacitor C must be chosen such that it is high enough to make sure that the frequency f of the signal F is not attenuated, i.e. cut-off, by the high pass filter.

Assume that the current sources 337, 337' are implemented by p-type MOS transistors. Therefore, their aspect ratios, i.e. Wp/Lp, can be selected, with respect to the aspect ratios of the n-type MOS transistors 339, 339', i.e. Wn/Ln, such that the switching point, i.e. the threshold voltage, of the switched current sources 335 and 335' are substantially equal to the voltage at the output 340 of the reference generator 325, i.e. Vdd/2. Therefore, the switched current sources 335 and 335' can be biased in their linear operating regions at the point Vdd/2.

Similarly, in an embodiment of the present invention, in the example where four cascaded switched current sources 335', 361, 362 and 363 were illustrated, all their associated current sources can be implemented by suitably dimensioned p-type MOS transistors and the switched current sources can therefore be designed such that their threshold voltages are substantially equal to Vdd/2 by using the current source load inverter 335 as a reference model.

Figure 5:
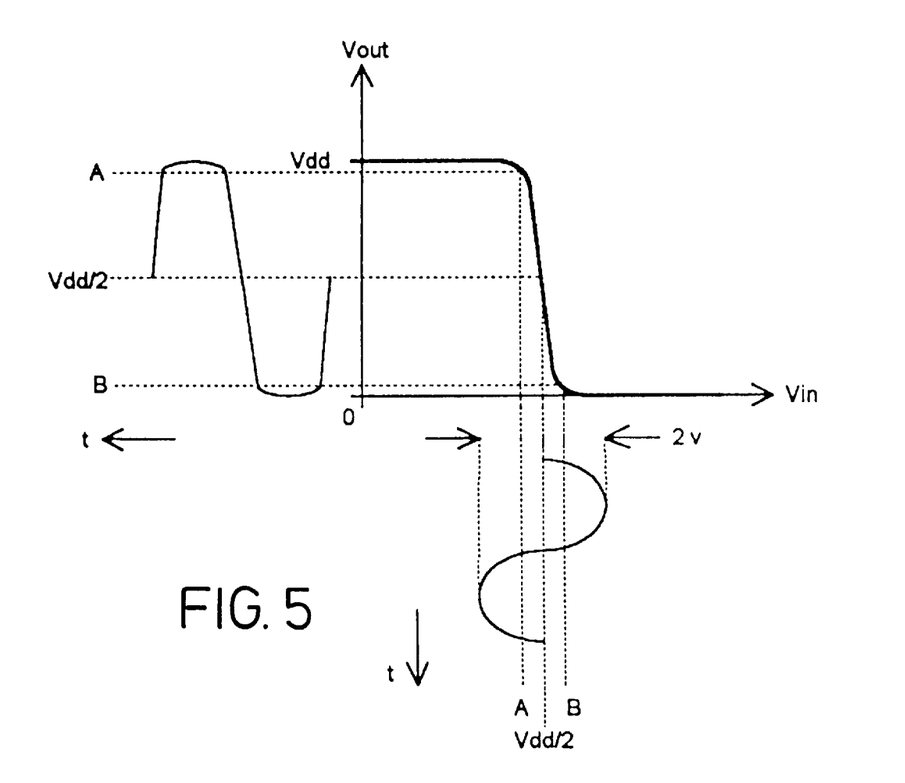
FIG. 5 illustrates a representation of the transfer function of a current source load inverter according to the present invention.

FIG. 5 illustrates a representation of the transfer function of a current source load inverter according to the present invention.

In the case of the current source load inverter 335', the 2 volt peak-to-peak signal F is biased, due to the resistor R, about the voltage level Vdd/2, i.e. substantially in the middle of the linear region of the current source load inverter 335'. When the input signal F of the switch transistor 339' increases beyond Vdd/2, the switch transistor 339' turns on and its drain terminal 350' is pulled down to substantially the voltage level Vss, i.e. Vout=Vss. Alternatively, when the input signal F of the switch transistor 339' decreases beyond Vdd/2 the switch transistor 339' turns off and its drain terminal 350' is now pulled up to substantially the voltage level Vdd, i.e. Vout=Vdd.

Figure 6:
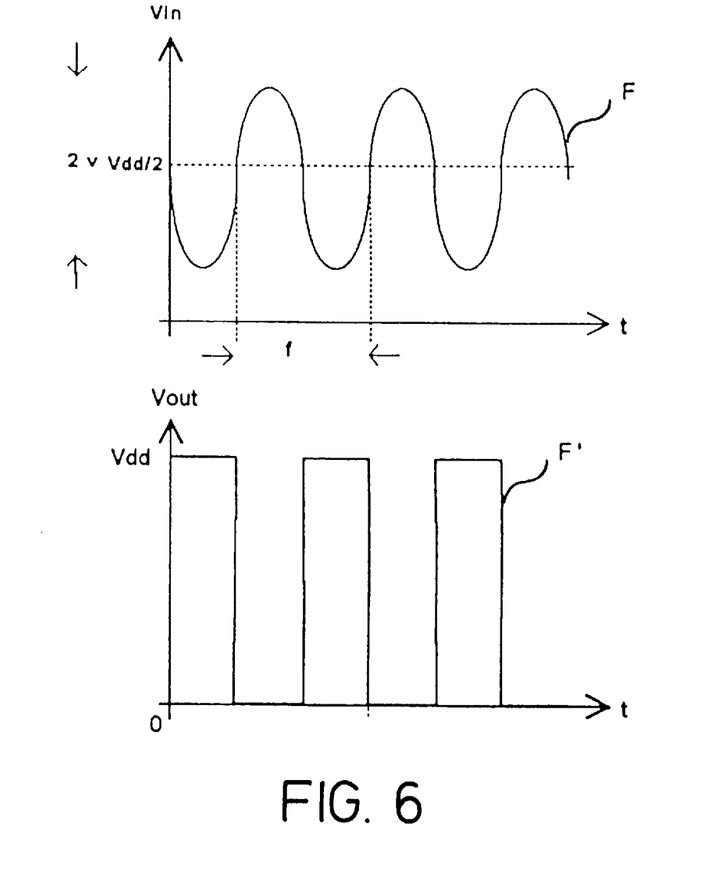
FIG. 6 illustrates typical input and output voltages of the first current source load inverter of FIG. 3.

In the preferred embodiment of the current invention, the remaining switched current sources 361, 362, 363 serve to increase the gain of the original input signal F and therefore ensure that the output signal duty cycle equals, or substantially equals 50%; it should be noted that it may be possible to increase or decrease the number of these switched current sources depending upon the design requirements. The required principle of this pull up and pull down on terminal 383 is illustrated in FIG. 6.

The fanout, i.e. the driving capability, of these switched current sources can be increased by increasing the respective aspect ratios of the n and p-type MOS transistors for each successive current source load inverter; assuming a CMOS process is involved.

One example of increasing the gain and the fanout, i.e. the driving capability, of each of the switched current sources 335', 361, 362 and 363 is by implementing the current sources 337, 337', 366, 367 and 368 using p-type MOS transistors that have the respective W/L ratios of 9/0.7, 9/0.7, 18/0.7, 36/0.7, 54/0.7 and matching these with respective n-type MOS transistors have W/L ratios of 3.3/0.7, 3.3/0.7, 6.6/0.7, 13.2/0.7, 26.4/0.7. Note that it is preferable that the W/L aspect ratios of the switched current sources 335 and 335' are the same, thereby ensuring bias compatibility, however, they can be different.

It is also preferable to buffer the signal F' by introducing it to one or more buffers, for example CMOS inverters (not illustrated).

From FIGS. 3, 5 and 6 it can be seen that the output signal F' will have a duty cycle substantially equal to 50%. In fact the inventor found that the duty cycle varied between approximately 48.5%–51.5% for an integrated circuit version of the schematic of FIG. 3; of course the crystal 305 and the band pass filter 300 were external non-integrated elements.

Integrating on a monolithic semiconductor allows one to obtain matched precision components. Excess threshold voltage dispersions of the switched current sources can be reduced by trimming the bias voltage. This trimming of the bias voltage can be achieved by adjusting, for example, the resistive elements that constitute the reference generator 325. These resistive elements can be accurately adjusted by using known laser trimming techniques for example; incidentally, this technique can also be used to adjust any offset voltage that is introduced by the amplifier 330.

Figure 7:
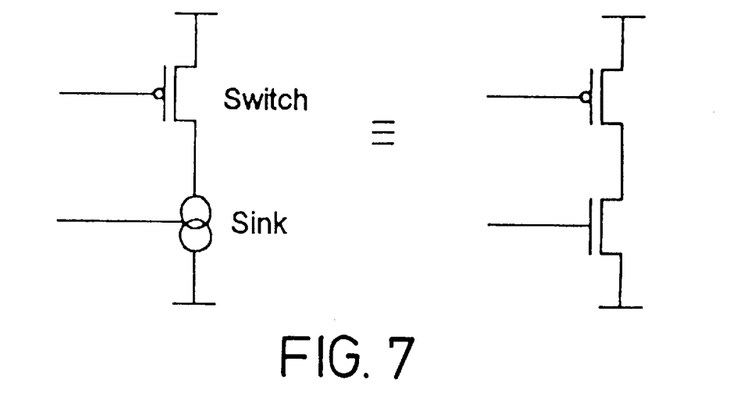
FIG. 7 illustrates an embodiment of the circuitry 210 where the switched current source is implemented by operatively connected and controlled p-type MOS switch and an n-type current sinks.

Another embodiment to the circuitry 200 and 210 of FIG. 3 is where the switched current sources are implemented by operatively connected and controlled p-type MOS switches and n-type current sinks. Such an embodiment can be readily implemented by those skilled in the art and is illustrated in FIG. 7. For the purposes of this text, the term 'current source' is intended to refer to a current source or a current sink.

Although this invention has been described in connection with certain preferred embodiments, it should be understood that the present disclosure is to be considered as an exemplification of the principles of the invention and that there is no intention of limiting the invention to the disclosed embodiments. On the contrary, it is intended that all alternatives, modifications and equivalent arrangements as may be included within the spirit and scope of the appended claims be covered as part of this invention.

What is claimed is:

1. A circuit comprising:

an oscillator that provides a first control signal having a frequency f;

a reference generator that provides a first reference signal representing a voltage difference between a first voltage supply and a second voltage supply;

a control circuit that provides a second control signal, the control circuit being responsive to the first reference signal and a second reference signal;

a first current source load inverter that provides the second reference signal, the first current source load inverter being responsive to the second control signal, said second reference signal being substantially equal to the first reference signal; and an output circuit that provides a final output signal having a duty cycle substantially equal to 50% and a frequency substantially equal to f, wherein the output circuit includes a second current source load inverter that is responsive to the first and second control signals, wherein:

the first current source load inverter comprises a first current source and a first switch that are serially connected between the first and second voltage supplies, the first current source being responsive to the second control signal for providing the second reference signal at a common connection between the first current source and the first switch, the first switch being responsive to the second reference signal; and the second current source load inverter comprises a second current source that is substantially identical to the first current source and a second switch that is substantially identical to the first switch, the second current source and the second switch being serially connected between the first and second voltage supplies, the second current source being responsive to the second control signal for providing an output signal corresponding to the final output signal at a common connection between the second current source and the second switch, the second current source load inverter having a resistor and a capacitor attached to it, the capacitor being connected to a control terminal of the second switch that is responsive to the first control signal which is a.c. coupled to the control terminal via the capacitor, the resistor being connected between the common connection of the second current source and the second switch and the control terminal of the second switch so as to d.c. bias said common connection between the second current source and the second switch.

2. The circuit according to claim 1, wherein the first and second current sources are p-type MOS transistors and the first and second switches are n-type MOS transistors.

3. The circuit according to claim 1, wherein the first and second current sources are n-type MOS transistors and the first and second switches are p-type MOS transistors.

4. The circuit according to claim 1, wherein the output circuit includes a plurality of additional second current source load inverters which are each substantially the same as the first current source load inverter.

5. The circuit according to claim 4, wherein:

each additional second current source load inverter of the plurality of additional second current source load inverters comprises a respective current source and a respective switch serially connected between the first and second voltage supplies and having a common connection between the respective current source and the respective switch;

the additional second current source load inverters are connected in series, such that the common connection between the respective current source and the respective switch of a previous load inverter of the plurality of additional second current source load inverters is connected to a control terminal of the respective switch of a subsequent load inverter of the plurality of additional second current source load inverters wherein the output signal of the second current source load inverter is connected to the control terminal of the respective switch of a first load inverter of the plurality of additional second current source load inverters; and the common connection between the respective current source and the respective switch of a last load inverter of the plurality of additional second current source load inverters provides the final output signal.

6. The circuit according to claim 5, wherein all of the current sources are p-type MOS transistors and all of the switches are n-type MOS transistors.

7. The circuit according to claim 5, wherein all of the current sources are n-type MOS transistors and all of the switches are p-type MOS transistors.

8. The circuit according to claim 1, wherein the final output signal is amplified by one or more buffers.

9. The circuit according to claim 1, wherein the reference generator comprises a potential divider network.

10. The circuit according to claim 9, wherein the potential divider network is adjustable.

11. The circuit according to claim 1, wherein the control circuit comprises an amplifier having a positive input that is responsive to the first reference signal and a negative input that is responsive to the second reference signal.

12. The circuit according to claim 1, wherein the first reference signal represents half of the voltage difference between the first and second voltage supplies.

13. The circuit according to claim 1, wherein the first control signal is sinusoidal.

* * * * *

UNITED STATES PATENT AND TRADEMARK OFFICE
CERTIFICATE OF CORRECTION

PATENT NO. : 5,920,217
DATED : July 6, 1999
INVENTOR(S): Pascal Mellot

It is certified that error appears in the above-identified patent and that said Letters Patent is hereby corrected as shown below:

Title page,

Item [73] should read as follows:

[73] Assignee: SGS-Thomson Microelectronics Limited, Almondsbury Bristol, United Kingdom Signed and Sealed this Sixteenth Day of November, 1999

Attest:

Q. TODD DICKINSON

*Attesting Officer*    *Acting Commissioner of Patents and Trademarks*